(12) United States Patent
Shin et al.

(10) Patent No.: US 12,143,522 B2
(45) Date of Patent: Nov. 12, 2024

(54) ELECTRONIC DEVICE INCLUDING DISPLAY

(71) Applicant: Samsung Electronics Co., Ltd., Suwon-si (KR)

(72) Inventors: Sungyoung Shin, Suwon-si (KR); Minsuk Uhm, Suwon-si (KR); Yilin Wu, Suwon-si (KR); Dongseop Lee, Suwon-si (KR); Haechang Lee, Suwon-si (KR); Kwangtai Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 241 days.

(21) Appl. No.: 17/746,324

(22) Filed: May 17, 2022

(65) Prior Publication Data

US 2023/0052376 A1 Feb. 16, 2023

Related U.S. Application Data

(63) Continuation of application No. PCT/KR2022/006980, filed on May 16, 2022.

(30) Foreign Application Priority Data

Aug. 10, 2021 (KR) ........................ 10-2021-0105201

(51) Int. Cl.
*H04M 1/02* (2006.01)
(52) U.S. Cl.
CPC ...... *H04M 1/0264* (2013.01); *H04M 2250/52* (2013.01)

(58) Field of Classification Search
CPC ........................ H04M 1/0264; H04M 2250/52
See application file for complete search history.

(56) References Cited

U.S. PATENT DOCUMENTS

| 10,756,139 B2 | 8/2020 | Kim et al. |
| 11,074,856 B2 | 7/2021 | Zhao et al. |

(Continued)

FOREIGN PATENT DOCUMENTS

| CN | 110264894 A | 9/2019 |
| CN | 111180494 A | 5/2020 |

(Continued)

OTHER PUBLICATIONS

International Search Report dated Aug. 30, 2022, issued in International Application No. PCT/KR2022/006980.

*Primary Examiner* — Robert J Michaud
(74) *Attorney, Agent, or Firm* — Jefferson IP Law, LLP

(57) ABSTRACT

An electronic device is provided. The electronic device includes a display, a display driver integrated circuit (IC) that controls the display, a camera disposed in a display area, and a processor connected with the display driver IC and the camera. The display includes a normal area having a first pixel density, a camera light-receiving area where the camera is disposed and at least one pixel is disposed, the camera light-receiving area having a second pixel density lower than first pixel density, and a circuit area provided between the normal area and the camera light-receiving area and having a third pixel density, and a circuit that transfers a drive voltage to the pixel disposed in the camera light-receiving area is disposed in the circuit area. The third pixel density is lower than or equal to the first pixel density, and the third pixel density is higher than the second pixel density.

19 Claims, 12 Drawing Sheets

(56) References Cited

U.S. PATENT DOCUMENTS

| | | |
|---|---|---|
| 11,087,662 B2 | 8/2021 | Yen |
| 11,139,284 B2 | 10/2021 | Chi et al. |
| 11,152,433 B2 | 10/2021 | Liu |
| 11,217,639 B2 | 1/2022 | Baek et al. |
| 11,263,968 B2 | 3/2022 | Wang et al. |
| 11,315,469 B2 | 4/2022 | Li et al. |
| 11,444,130 B2 | 9/2022 | Tan |
| 11,462,590 B2 | 10/2022 | Fan et al. |
| 11,574,600 B2 | 2/2023 | Hyun et al. |
| 2017/0289805 A1* | 10/2017 | Hong .................. H04W 12/08 |
| 2018/0158879 A1 | 6/2018 | Kim et al. |
| 2018/0219058 A1 | 8/2018 | Xiang et al. |
| 2019/0326366 A1 | 10/2019 | Fan et al. |
| 2020/0066809 A1 | 2/2020 | Liu |
| 2020/0312832 A1 | 10/2020 | Chi et al. |
| 2020/0319682 A1* | 10/2020 | Moon .................. G06F 1/1626 |
| 2021/0020664 A1 | 1/2021 | Tan |
| 2021/0026419 A1 | 1/2021 | Kim et al. |
| 2021/0043135 A1 | 2/2021 | Zhao et al. |
| 2021/0065625 A1 | 3/2021 | Wang et al. |
| 2022/0102446 A1 | 3/2022 | Baek et al. |
| 2023/0078129 A1 | 3/2023 | Li et al. |
| 2023/0162682 A1 | 5/2023 | Wang et al. |
| 2023/0178030 A1 | 6/2023 | Hyun et al. |

FOREIGN PATENT DOCUMENTS

| | | |
|---|---|---|
| CN | 112017549 A | 12/2020 |
| KR | 10-2017-0113361 A | 10/2017 |
| KR | 10-2020-0036137 A | 4/2020 |
| KR | 10-2020-0117137 A | 10/2020 |
| KR | 10-2020-0122982 A | 10/2020 |
| KR | 10-2020-0144193 A | 12/2020 |
| KR | 10-2021-0009368 A | 1/2021 |
| KR | 10-2021-0012316 A | 2/2021 |
| WO | 2019/062221 A1 | 4/2019 |

* cited by examiner

ELECTRONIC DEVICE INCLUDING DISPLAY

CROSS-REFERENCE TO RELATED APPLICATION(S)

This application is a continuation application, claiming priority under § 365(c), of an International application No. PCT/KR2022/006980, filed on May 16, 2022, which is based on and claims the benefit of a Korean patent application number 10-2021-0105201, filed on Aug. 10, 2021, in the Korean Intellectual Property Office, the disclosure of which is incorporated by reference herein in its entirety.

TECHNICAL FIELD

The disclosure relates to an electronic device including a display.

BACKGROUND ART

An electronic device may include a display that displays an image. The display may include a plurality of pixels. The resolution of the image may be set depending on the arrangement density and the arrangement structure of the plurality of pixels. Each of the plurality of pixels may emit light with a luminance set according to a data voltage supplied from a data line connected thereto.

Nowadays, a display in an under display camera (UDC) form in which a camera is disposed under a display area of the display is being developed. The display area of the display in the under display camera form may include a normal area that is substantially the same as a display area of the display in which there is no camera and an under display area in which a structural change is caused by the camera. The under display area may include a camera light-receiving area through which an aperture of the camera receives light and a circuit area in which circuits for driving pixels disposed in the under display area are disposed.

The above information is presented as background information only to assist with an understanding of the disclosure. No determination has been made, and no assertion is made, as to whether any of the above might be applicable as prior art with regard to the disclosure.

DISCLOSURE

Technical Problem

The camera light-receiving area may pass light incident on the aperture of the camera. The camera light-receiving area may have a low pixel density to increase light transmittance.

Furthermore, circuits for driving pixels disposed in the camera light-receiving area and pixels disposed in the circuit area may be disposed in the circuit area. The area of the circuit area may be increased as the circuits for driving the pixels are disposed in the circuit area. The pixel density of the circuit area may be decreased as the circuits for driving the pixels are disposed in the circuit area. When the area of the circuit area is increased and the pixel density of the circuit area is decreased, the under display area including the circuit area may be heterogeneously viewed.

Aspects of the disclosure are to address at least the above-mentioned problems and/or disadvantages and to provide at least the advantages described below. Accordingly, an aspect of the disclosure is to provide an electronic device including a display having improved visibility of an under display area.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a display, a display driver integrated circuit (IC) that controls the display, a camera disposed in a display area of the display, and a processor operatively connected with the display driver IC and the camera. The display includes a normal area having a first pixel density, a camera light-receiving area where the camera is disposed and at least one pixel is disposed, the camera light-receiving area having a second pixel density lower than first pixel density, and a circuit area that is provided between the normal area and the camera light-receiving area and that has a third pixel density, and a circuit that transfers a drive voltage to the pixel disposed in the camera light-receiving area is disposed in the circuit area. The third pixel density is lower than or equal to the first pixel density, and the third pixel density is higher than the second pixel density.

In accordance with another aspect of the disclosure, an electronic device is provided. The electronic device includes a display including a bottom metal layer, a display driver IC that controls the display, a camera disposed in a display area of the display, and a processor operatively connected with the display driver IC and the camera. The display includes a normal area, a camera light-receiving area where the camera is disposed, and a circuit area provided between the normal area and the camera light-receiving area, and a circuit that transfers a drive voltage to a pixel disposed in the camera light-receiving area is disposed in the circuit area. At least part of a data line connected with a first electrode of at least one pixel disposed in the circuit area is implemented with the bottom metal layer.

In accordance with another aspect of the disclosure, a display having a display area under which a camera is disposed is provided. The display includes a normal area having a first pixel density, a camera light-receiving area where the camera is disposed and at least one pixel is disposed, the camera light-receiving area having a second pixel density lower than first pixel density, and a circuit area that is provided between the normal area and the camera light-receiving area and that has a third pixel density, and a circuit that transfers a drive voltage to the pixel disposed in the camera light-receiving area is disposed in the circuit area. The third pixel density is lower than or equal to the first pixel density, and the third pixel density is higher than the second pixel density.

Advantageous Effects

According to the embodiments of the disclosure, the visibility of the under display area may be improved by increasing the pixel density of the circuit area.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to like parts, components, and structures.

MODE FOR INVENTION

The following description with reference to accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
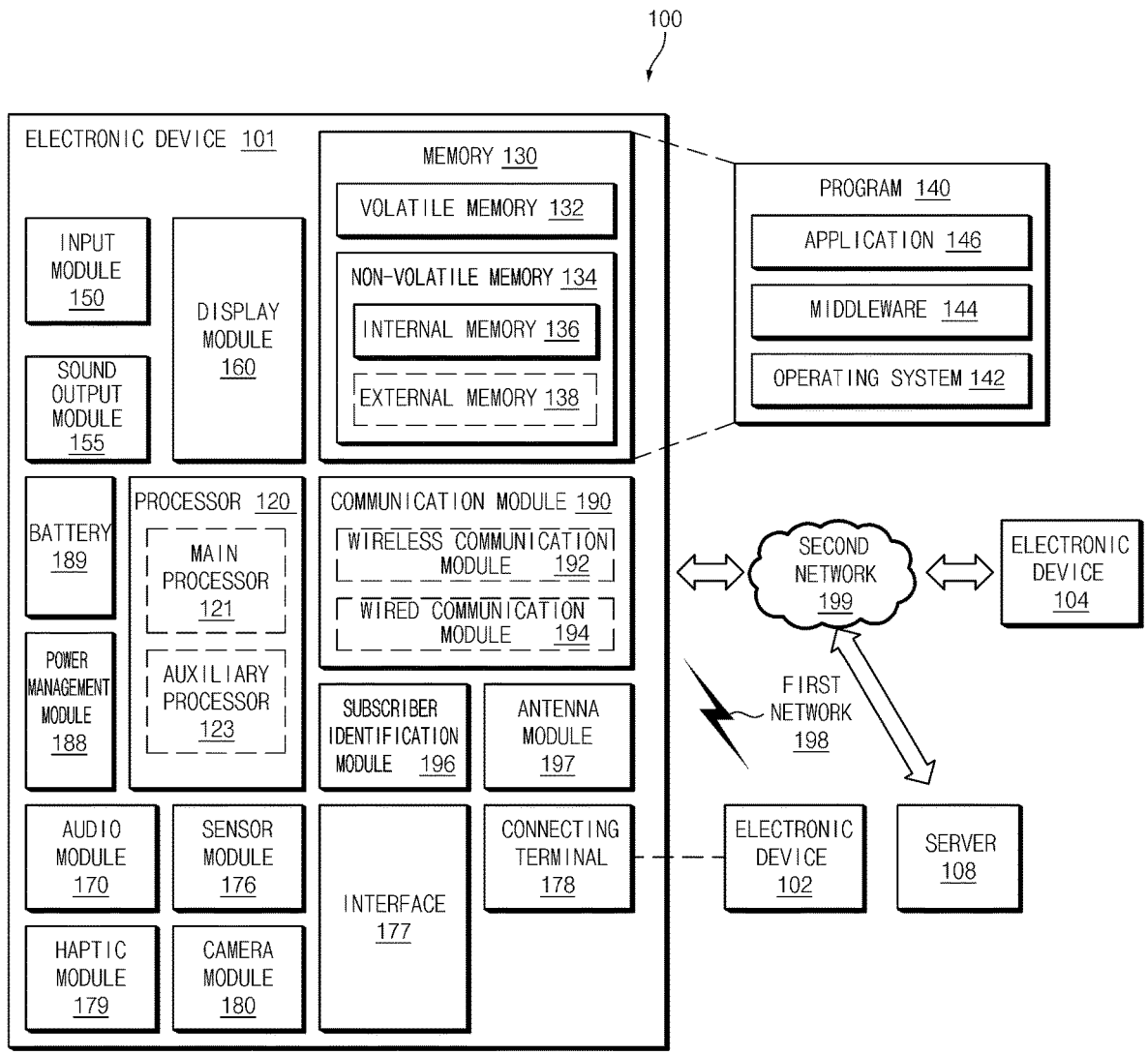
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
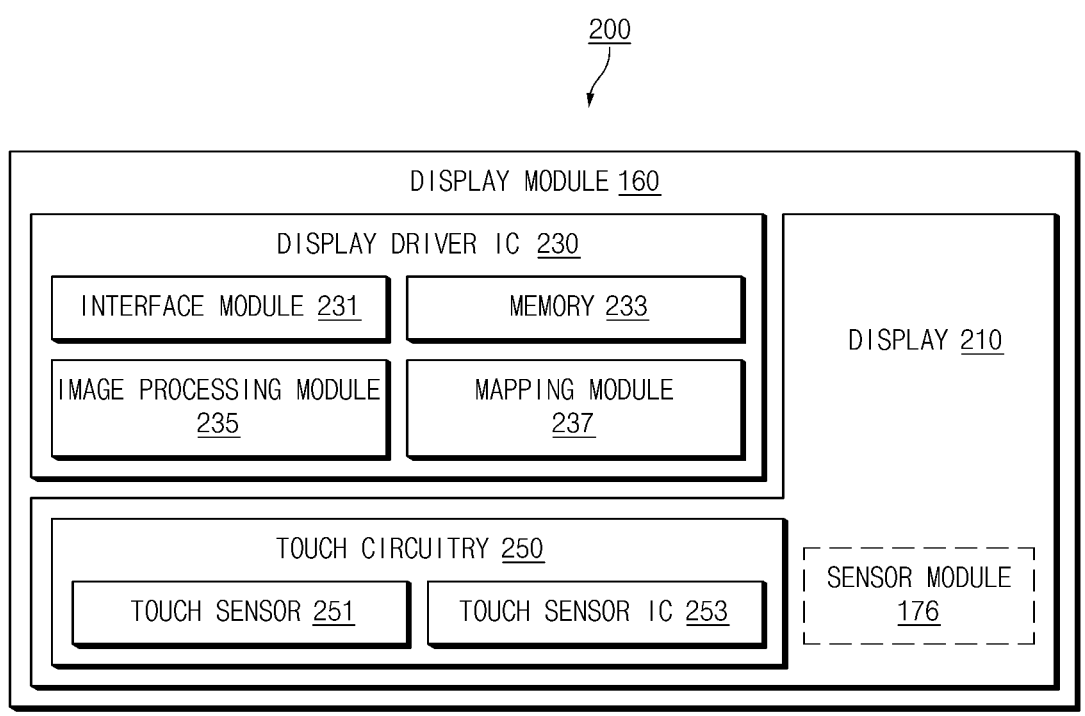
FIG. 2 is a block diagram illustrating the display module according to an embodiment of the disclosure.

FIG. 2 is a block diagram 200 illustrating the display module 160 according to an embodiment of the disclosure.

Referring to FIG. 2, the display module 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
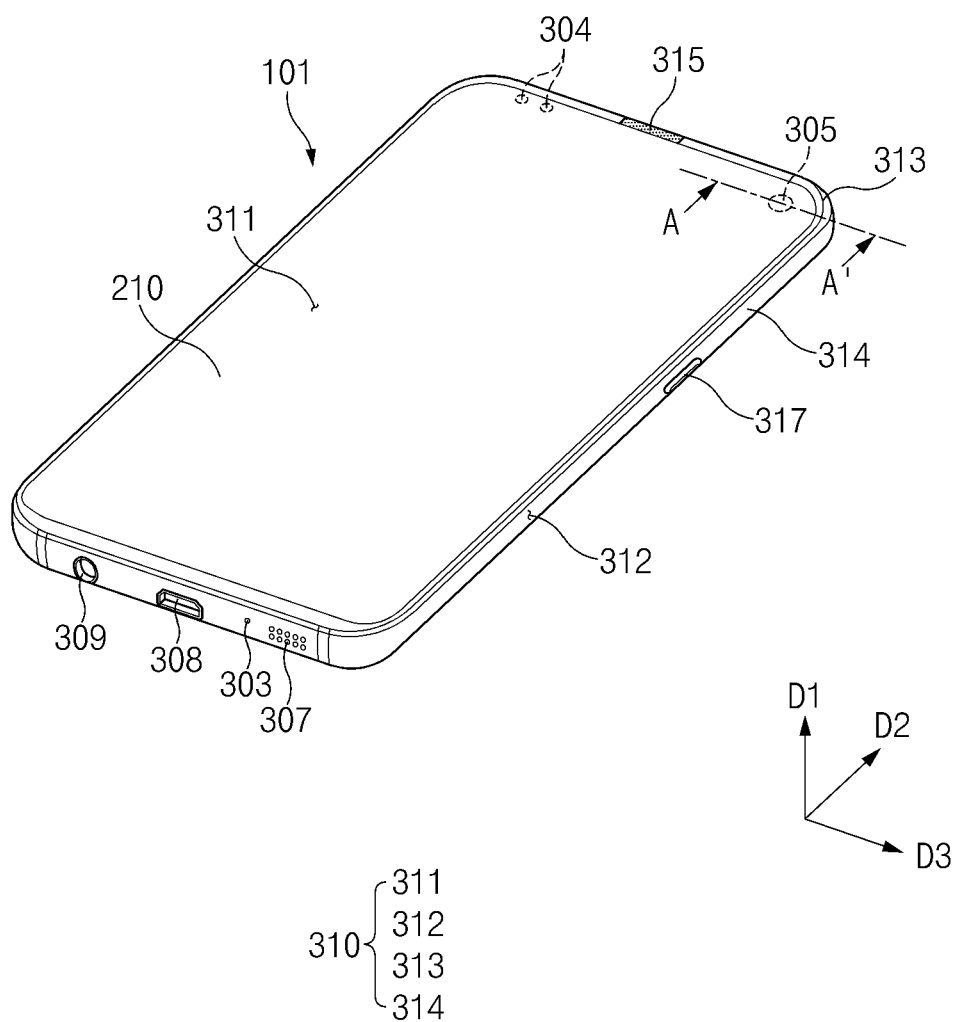
FIG. 3 is a front perspective view of an electronic device according to an embodiment of the disclosure.

FIG. 3 is a front perspective view of an electronic device 101 according to an embodiment of the disclosure.

Referring to FIG. 3, the electronic device 101 may include a housing 310. The housing 310 may include a first surface (or, a front surface) 311, a second surface (or a rear surface) (not illustrated), and a side surface 312 surrounding a space between the first surface 311 and the second surface. The first surface 311 of the housing 310 may include a front plate 313 (e.g., a glass plate including various coating layers, or a polymer plate), at least a portion of which is substantially transparent. The second surface of the housing 310 may include a back plate (not illustrated) that is substantially opaque. For example, the back plate (not illustrated) may contain coated or colored glass, ceramic, polymer, metal (e.g., aluminum, stainless steel (STS), or magnesium), or a combination of at least two of the aforementioned materials. The side surface 312 of the housing 310 may include a side bezel structure 314 (or, a "side member") that is coupled with the front plate 313 and the back plate and that contains metal and/or polymer. According to an embodiment of the disclosure, the back plate and the side bezel structure 314 may be integrally formed with each other, or may contain the same material (e.g., a metallic material such as aluminum).

The electronic device 101 may include at least one of a display 210, an input device 303 (e.g., the input module 150 of FIG. 1), sound output devices 307 and 315 (e.g., the sound output module 155 of FIG. 1), a sensor 304 (e.g., the sensor module 176 of FIG. 1), a camera 305 (e.g., the camera module 180 of FIG. 1), key input devices 317 (e.g., the input module 150 of FIG. 1), an indicator (not illustrated), or connector holes 308 and 309 (e.g., the connecting terminal 178 of FIG. 1). According to an embodiment of the disclosure, the electronic device 101 may omit at least one component (e.g., the key input devices 317 or the indicator) among the aforementioned components, or may additionally include other component(s).

The display 210 may be visible through most of the front plate 313. The display 210 may display a screen and may sense a touch. At least part of the sensor 304 and/or at least part of the camera 305 may be disposed in the display 210.

The input device 303 may include a microphone. The input device 303 may include a plurality of microphones disposed to sense the direction of a sound.

The sound output devices 307 and 315 may include speakers. The sound output devices 307 and 315 may include the external speaker 307 and the receiver for telephone call 315. The input device 303, the sound output devices 307 and 315, and the connectors 308 and 309 may be exposed to an external environment through at least one hole formed in the housing 310. The hole formed in the housing 310 may be commonly used for the input device 303 and the sound output devices 307 and 315. The sound output devices 307 and 315 may include a speaker (e.g., a piezoelectric speaker) that operates without the hole of the housing 310.

The sensor 304 may generate an electrical signal or a data value that corresponds to an operational state inside the electronic device 101 or an environmental state external to the electronic device 101. For example, the sensor 304 may be a proximity sensor disposed on the first surface 311 of the housing 310. The sensor 304 may be disposed under the display 210. The electronic device 101 according to an embodiment may further include at least one of a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, an illuminance sensor, or an HRM sensor.

The camera 305 may be a front camera disposed on the first surface 311 of the electronic device 101. The electronic device 101 may further include a rear camera (not illustrated) and/or a flash (not illustrated) disposed on the second surface. The camera 305 may include one or more lenses, an image sensor, and/or an image signal processor. The flash may include a light emitting diode or a xenon lamp. In some embodiments, two or more lenses (e.g., a wide lens, an ultra wide lens, or a telephoto lens) and image sensors may be disposed on one surface of the electronic device 101.

The key input devices 317 may be disposed on the side surface 312 of the housing 310. According to an embodiment of the disclosure, the electronic device 101 may omit one or more of the key input devices 317. The key input devices 317 not included may be implemented in the form of a soft key on the display 210. In another embodiment, the key input devices 317 may be implemented by using a pressure sensor included in the display 210.

The indicator may be disposed on the first surface 311 of the housing 310. The indicator may provide state information of the electronic device 101 in the form of light. The indicator may provide a light source that operates in conjunction with operation of the camera 305. The indicator may include an LED, an IR LED, and a xenon lamp.

The connector holes 308 and 309 may include the first connector hole 308 capable of accommodating a connector (e.g., a USB connector) for transmitting and receiving power and/or data with an external electronic device, and/or the second connector hole (or, the earphone jack) 309 capable of accommodating a connector for transmitting and receiving audio signals with an external electronic device.

According to an embodiment of the disclosure, the camera 305, the sensor 304, or the indicator may be disposed to be visible through the display 210. For example, the camera 305, the sensor 304, or the indicator may be located in an inner space of the electronic device 101 and may be disposed so as to be in contact with an external environment through a through-hole bored through the front plate 313 of the display 210. In another embodiment of the disclosure, the sensor 304 may be disposed to perform a function thereof without being visually exposed through the front plate 313 in the inner space of the electronic device. In this case, a through-hole may be unnecessary in the area of the display 210 that faces the sensor 304. For example, the camera 305 may include an under display camera (UDC) that is not visually exposed on the first surface 311 and disposed on a rear surface of the display 210. For example, the camera 305 may be located inside some layers of the display 210. Furthermore, the camera 305 may be disposed such that the optical axis of a lens of the camera 305 passes through the first surface 311 of the display 210.

A partial area of the display 210 that faces the camera 305 may be formed to be a camera light-receiving area that has a specified transmittance as a portion of a display area where contents are displayed. In an embodiment, the camera light-receiving area may be formed to have a transmittance of about 25% to about 50%. In another example, the camera light-receiving area may be formed to have a transmittance of about 50% or more. The camera light-receiving area may include an area through which light for generating an image by being focused on an image sensor (e.g., an image sensor 480 of FIG. 4) passes and that overlaps an effective area (e.g., a field of view (FOV)) of the camera 305. For example, the camera light-receiving area of the display 210 may include an area having a lower pixel density and/or wiring density than a surrounding area.

Figure 4:
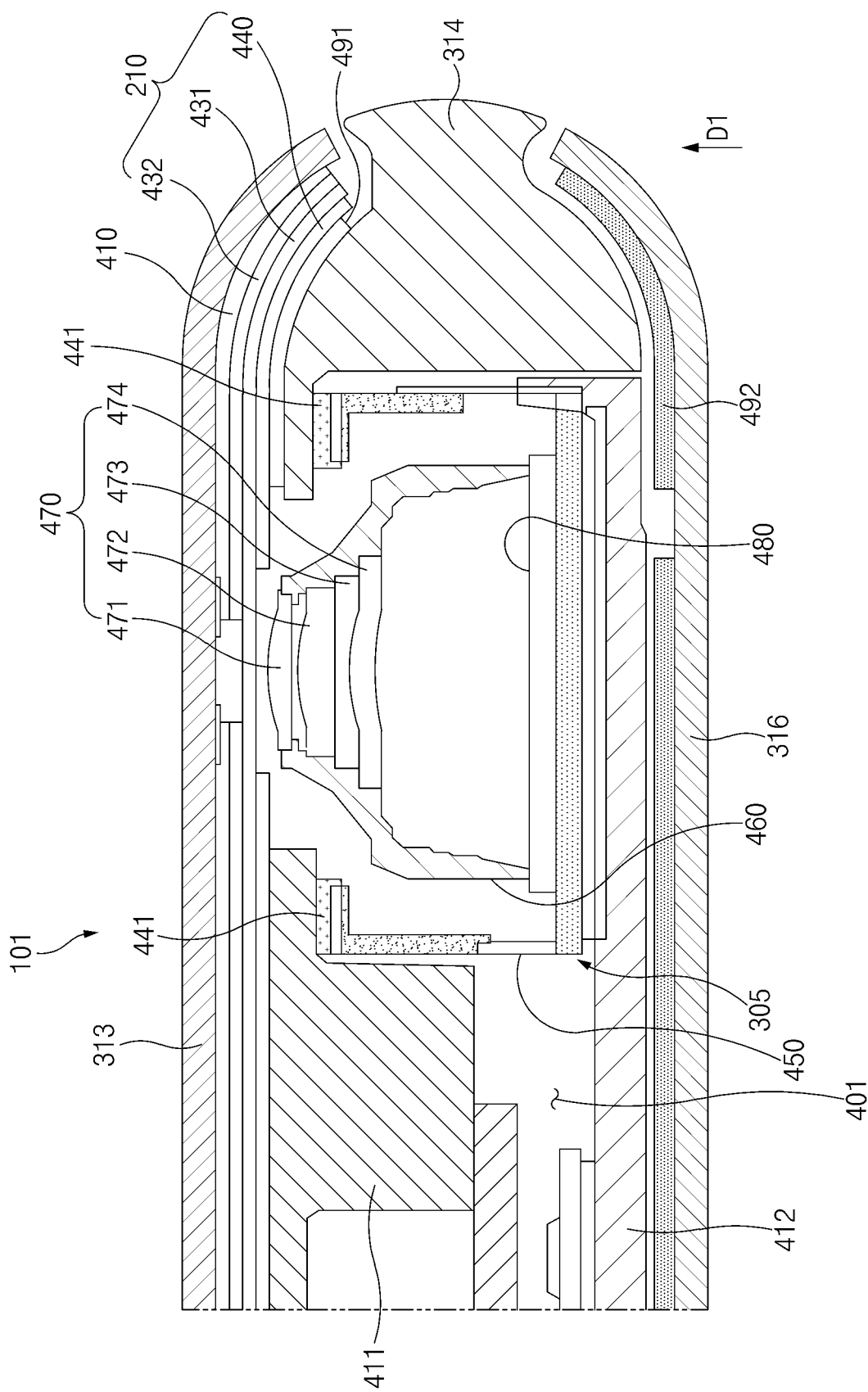
FIG. 4 is a sectional view taken along line A-A' in FIG. 3 according to an embodiment of the disclosure.

FIG. 4 is a sectional view taken along line A-A' in FIG. 3 according to an embodiment of the disclosure.

Referring to FIG. 4, the electronic device 101 may include the front plate 313 facing a first direction D1, a back plate 316 facing the direction opposite to the first direction D1, and the side member 314 surrounding a space 401 between the front plate 313 and the back plate 316. The electronic device 101 may include an adhesive layer 410 and the display 210 that are disposed between a rear surface of the front plate 313 and the side member 314.

The display 210 may include a display panel 431, a polarizer layer 432, and a subsidiary material layer 440. The subsidiary material layer 440 may include at least one of a touch panel (e.g., the touch circuitry 250 of FIG. 2), a light blocking layer, a buffer layer, a digitizer, a functional member, or a conductive member.

The display panel 431 may be disposed between the front plate 313 and the camera 305. The display panel 431 may be implemented to be at least partially transparent such that external light is incident on the camera 305 through the display panel 431.

The adhesive layer 410, the polarizer layer 432, and the subsidiary material layer 440 may include openings. A through-hole may be formed through at least parts of areas of the adhesive layer 410 and the polarizer layer 432 that overlap the camera 305. A through-hole having a larger diameter than the through-hole formed through the adhesive layer 410 and the polarizer layer 432 may be formed through the subsidiary material layer 440.

The electronic device 101 may include a first support member 411, at least part of which is disposed in the space 401. The first support member 411 may support the display 210 and the camera 305. The first support member 411 may support the subsidiary material layer 440 of the display 210. The first support member 411 may support the camera 305 such that the camera 305 is at least partially disposed in the opening of the subsidiary material layer 440 of the display 210. The camera 305 may be attached to a rear surface of the first support member 411 through an adhesive member 441 (e.g., a bonding member or a tape member) after aligned with the opening of the subsidiary material layer 440 of the display 210 through an opening of the first support member 411.

The camera 305 may include a camera housing 450, a lens housing 460 that is disposed in an inner space of the camera housing 450 and that at least partially protrudes in the first direction D1, a plurality of lenses 470 disposed at predetermined intervals in an inner space of the lens housing 460, and at least one image sensor 480 disposed in the inner space of the camera housing 450 so as to be aligned with the plurality of lenses 470. When the camera 305 includes an auto focus (AF) function, the lens housing 460 may be moved in the camera housing 450 by a predetermined drive unit such that the distance to the display panel 431 is varied. According to another embodiment of the disclosure, the camera housing 450 may be omitted from the camera 305, and the lens housing 460 may be directly disposed on the first support member 411 through a predetermined alignment process. The camera 305 may be supported by the first support member 411. The camera 305 may be supported by a second support member 412 (e.g., a rear case).

The plurality of lenses 470 may include a first lens 471, a second lens 472, a third lens 473, and a fourth lens 474 disposed through the lens housing 460. Among the plurality of lenses 470, the first lens 471 may be disposed closest to the display panel 431. The plurality of lenses 470 may be disposed to correspond to the openings formed through the adhesive layer 410, the polarizer layer 432, and the subsidiary material layer 440.

The electronic device 101 may further include a first waterproof member 491 disposed between the subsidiary material layer 440 of the display 210 and the side member 314. The electronic device 101 may include a second waterproof member 492 disposed between the side member 314 and the back plate 316. The first waterproof member 491 and the second waterproof member 492 may prevent infiltration of external foreign matter or moisture into the inner space 401 of the electronic device 101.

Figure 5A:
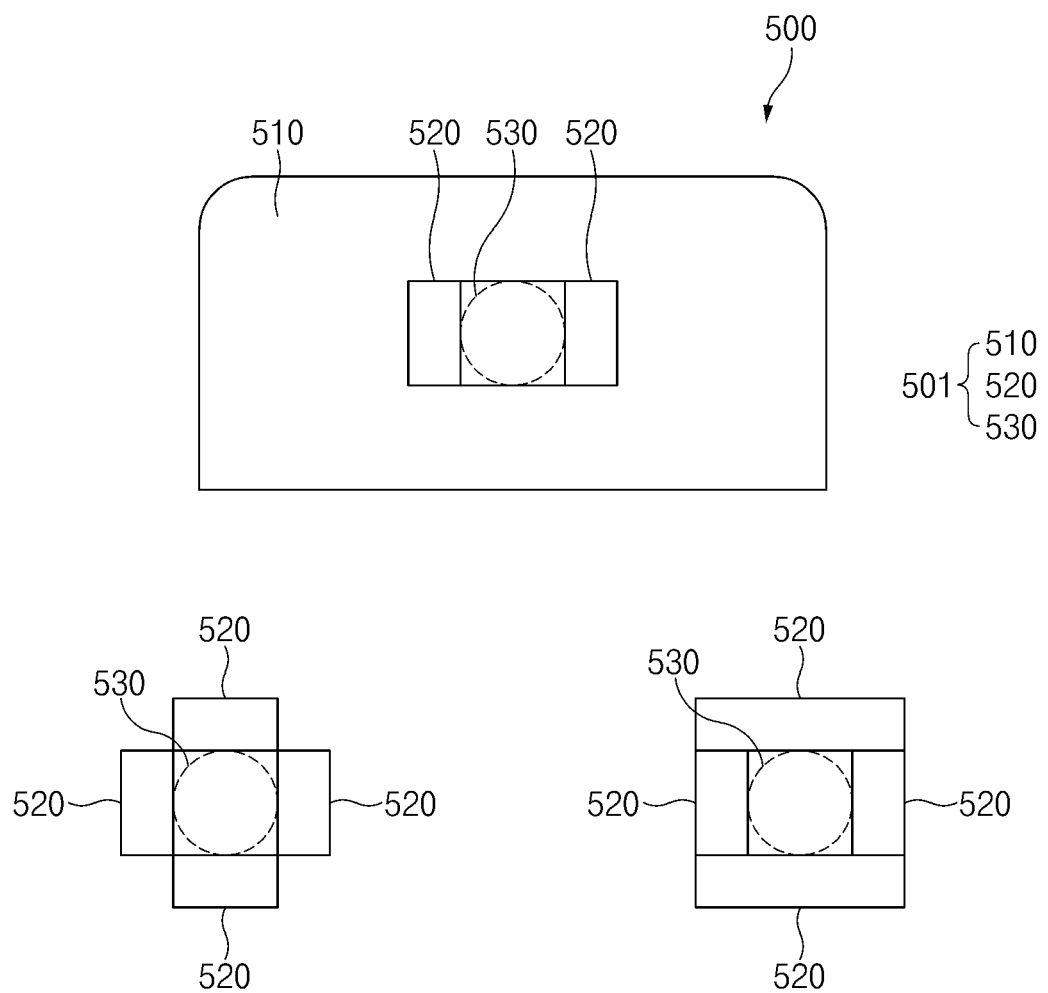
FIG. 5A is a view illustrating a display of an electronic device according to an embodiment of the disclosure.
Figure 5B:
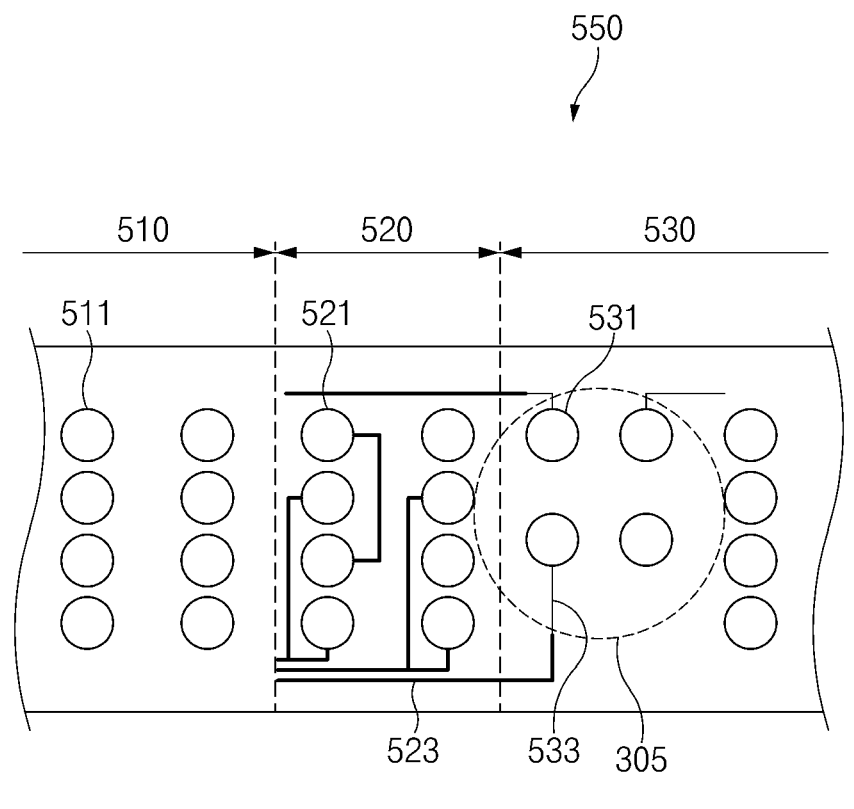
FIG. 5B is a view illustrating the display of the electronic device according to an embodiment of the disclosure.

FIG. 5A is a view 500 illustrating a display (e.g., the display 210 of FIG. 4) of an electronic device (e.g., the electronic device 101 of FIG. 4) according to an embodiment of the disclosure. FIG. 5B is a view 550 illustrating the display 210 of the electronic device 101 according to an embodiment of the disclosure.

Referring to FIGS. 5A and 5B, the display 210 may have an under display camera (UDC) form in which the camera 305 is disposed under a display area of the display 210. In this document, the camera 305 may refer to a field of view of an under display camera. The display 210 may have a hole less structure in which there is no hole or trench structure due to the camera 305. The display 210 may include a normal area 510, a circuit area 520, and a camera light-receiving area 530. The normal area 510, the circuit area 520, and the camera light-receiving area 530 may be areas included in an under display area 501 in a broad sense. The under display area 501 in a broad sense may be an area defined in a general under display technology field. However, without being limited thereto, the circuit area 520 and the camera light-receiving area 530 may correspond to an under display area 540 in a narrow sense where a structural change of pixels is caused by the camera 305. In this document, the under display area 540 may refer to the circuit area 520 and the camera light-receiving area 530 where a structural change of pixels is caused by the camera 305.

Referring to FIGS. 5A and 5B, the normal area 510 may be substantially the same area as the normal display area of the display 210. A first group of pixels and circuits for driving the first group of pixels may be disposed in the normal area 510. The first group of pixels may include first light emitting elements 511. For example, a light emitting element may collectively refer to an anode. In another example, a light emitting element may include an anode and an emissive layer containing a light emitting material. The circuits of the normal area 510 may form first circuits. The first circuits may be disposed to be in one-to-one correspondence with the first light emitting elements 511.

The normal area 510 may have a first pixel density. In this document, a pixel density may be the number of light emitting elements of pixels disposed per unit area. The pixel density may be set depending on the resolution of the display. The first pixel density may be substantially the same as the pixel density of the normal display area of the display 210. The pixel density may be expressed as pixels per inch (ppi) or dots per inch (dpi). For example, the first pixel density may be not less than about 200 dpi and not more than about 400 dpi. In another example, as illustrated in FIG. 5B, eight first light emitting elements 511 per unit area may be disposed in the normal area 510 having the first pixel density.

The circuit area 520 may be an area where circuits for driving pixels 521 and 531 disposed in the under display area 540 are disposed. For example, the circuit area 520 may be disposed on the left side and the right side of the camera light-receiving area 530. In another example, the circuit area 520 may be disposed on the left side, the right side, the upper side, and the lower side of the camera light-receiving area 530. In another example, the circuit area 520 may be disposed on only one side of the camera light-receiving area 530. Second light emitting elements 521 and a first transmission line 523 may be disposed in the circuit area 520. The second light emitting elements 521 may be included in a second group of pixels of the circuit area 520.

The camera light-receiving area 530 may be an area through which an aperture of the camera 305 receives light. The camera 305 may be disposed under the camera light-receiving area 530. Third light emitting elements 531 and a second transmission line 533 may be disposed in the camera light-receiving area 530. The third light emitting elements 531 may be included in a third group of pixels of the camera light-receiving area 530.

The camera light-receiving area 530 may have a second pixel density. The second pixel density may be lower than the first pixel density. The camera light-receiving area 530 may have light transmittance for the camera 305 to receive external light. To increase the light transmittance, the camera light-receiving area 530 may have a lower pixel density than the normal area 510. For example, as illustrated in FIG. 5B, four third light emitting elements 531 per unit area may be disposed in the camera light-receiving area 530 having the second pixel density. In another example, the third light emitting elements 531 may be disposed in the camera light-receiving area 530 at an arrangement density of about 25%, compared to the first light emitting elements 511 of the normal area 510. Light may pass through between the third light emitting elements 531 by decreasing the density at which the third light emitting elements 531 are disposed in the camera light-receiving area 530. Accordingly, light may pass through the camera light-receiving area 530 while a screen is displayed through the third light emitting elements 531 in the camera light-receiving area 530, and the aperture of the camera 305 may receive the light.

Circuits for driving the third light emitting elements 531 may be disposed in the circuit area 520. In the camera light-receiving area 530, a circuit for scanning may not exist, and only data lines and anodes may exist. Accordingly, the circuits for driving the third light emitting elements 531 may not be disposed in the camera light-receiving area 520, and thus the light transmittance of the camera light-receiving area 530 may be increased. However, without being necessarily limited thereto, at least a part of the circuits for driving the third light emitting elements 531 may be disposed in the camera light-receiving area 530 when a specified condition is satisfied in relation to light receiving of the camera 305.

The circuit area 520 may have a third pixel density. The third pixel density may be lower than or equal to the first pixel density and may be higher than or equal to the second pixel density. Second circuits for driving the second light emitting elements 521 of the circuit area 520 and third circuits for driving the third light emitting elements 531 of the camera light-receiving area 530 may be disposed in the circuit area 520. To dispose the second circuits and the third circuits for driving the under display area 540 in the circuit area 520, the number of pixels disposed in the circuit area 520 may be decreased. Furthermore, to secure the performance of the camera 305 disposed adjacent to the circuit area 520, the number of pixels disposed in the circuit area 520 may be decreased.

According to an embodiment of the disclosure, in the circuit area 520, the second circuits and the second light emitting elements 521 may not be in one-to-one correspondence with each other. The number of second light emitting elements 521 may be larger than the number of second circuits. The number of second light emitting elements 521 may be larger than the number of second circuits for driving pixels disposed in the circuit area 520. For example, by increasing the number of second light emitting elements 521, the density at which the second light emitting elements 521 are disposed in the circuit area 520 may be substantially the same as the first pixel density at which the first light emitting elements 511 are disposed in the normal area 510. When the density at which the second light emitting elements 521 are disposed is substantially the same as the first pixel density, the circuit area 520 may be viewed as having substantially the same resolution as the normal area 510. Accordingly, the visibility of the circuit area 520 may be improved.

At least one pixel disposed in the circuit area 520 may include a first pixel and a second pixel copied from the first pixel. The first pixel and the second pixel may be connected with the same circuit. For example, the first pixel and the second pixel may be implemented with two light emitting elements and one circuit. The first pixel and the second pixel may be operated by the same circuit. The first pixel and the second pixel may form a part of the second light emitting elements 521.

The first pixel and the second pixel may have the same color. The first pixel and the second pixel operated by the same circuit may emit light at the same timing. An emissive layer of the first pixel and an emissive layer of the second pixel may include light emitting bodies that emit light in the same color. Accordingly, a phenomenon in which an undesired color appears on a screen by a copied pixel may be prevented.

The first transmission line 523 may be connected with each of the second light emitting elements 521. The first transmission line 523 may be simultaneously connected with the first pixel and the second pixel of the second light emitting elements 521. The first transmission line 523 may supply signals and voltages such that the first pixel and the second pixel simultaneously operate and emit light.

The first transmission line 523 may be a data line connected with anodes of the second light emitting element 521. At least part of the first transmission line 523 may be implemented with a bottom metal layer (BML). The bottom metal layer may be substantially the same as a shield layer that blocks light in a low-temperature polycrystalline oxide (LTPO) display panel. When the first transmission line 523 is implemented with the bottom metal layer, a space for additionally disposing the second light emitting elements 521 in the circuit area 520 may be secured.

The second transmission line 533 may be a data line connected with anodes of the third light emitting elements 531. The second transmission line 533 may be implemented with a transparent member. In this case, since the second transmission line 533 is implemented with the transparent member, the light transmittance of the camera light-receiving area 530 may be increased.

The resistance of the bottom metal layer with which the first transmission line 523 is implemented may be lower than the resistance of the transparent member with which the second transmission line 533 is implemented. A drop in data voltage caused by the resistance of the second transmission line 533 may be reduced by implementing the second transmission line 533 with a low-resistance material and connecting the second transmission line 533 to the third light emitting elements 531, each having a long distance between a circuit and the light emitting element.

The resistance between the first transmission line 523 and the second transmission line 533 may be matched. For example, the resistance between the first transmission line 523 and the second transmission line 533 may be matched by adjusting the thickness and width of the first transmission line 523 or the second transmission line 533. In another example, the resistance between the first transmission line 523 and the second transmission line 533 may be matched by disposing a connecting resistor between the first transmission line 523 and the second transmission line 533.

Figure 6:
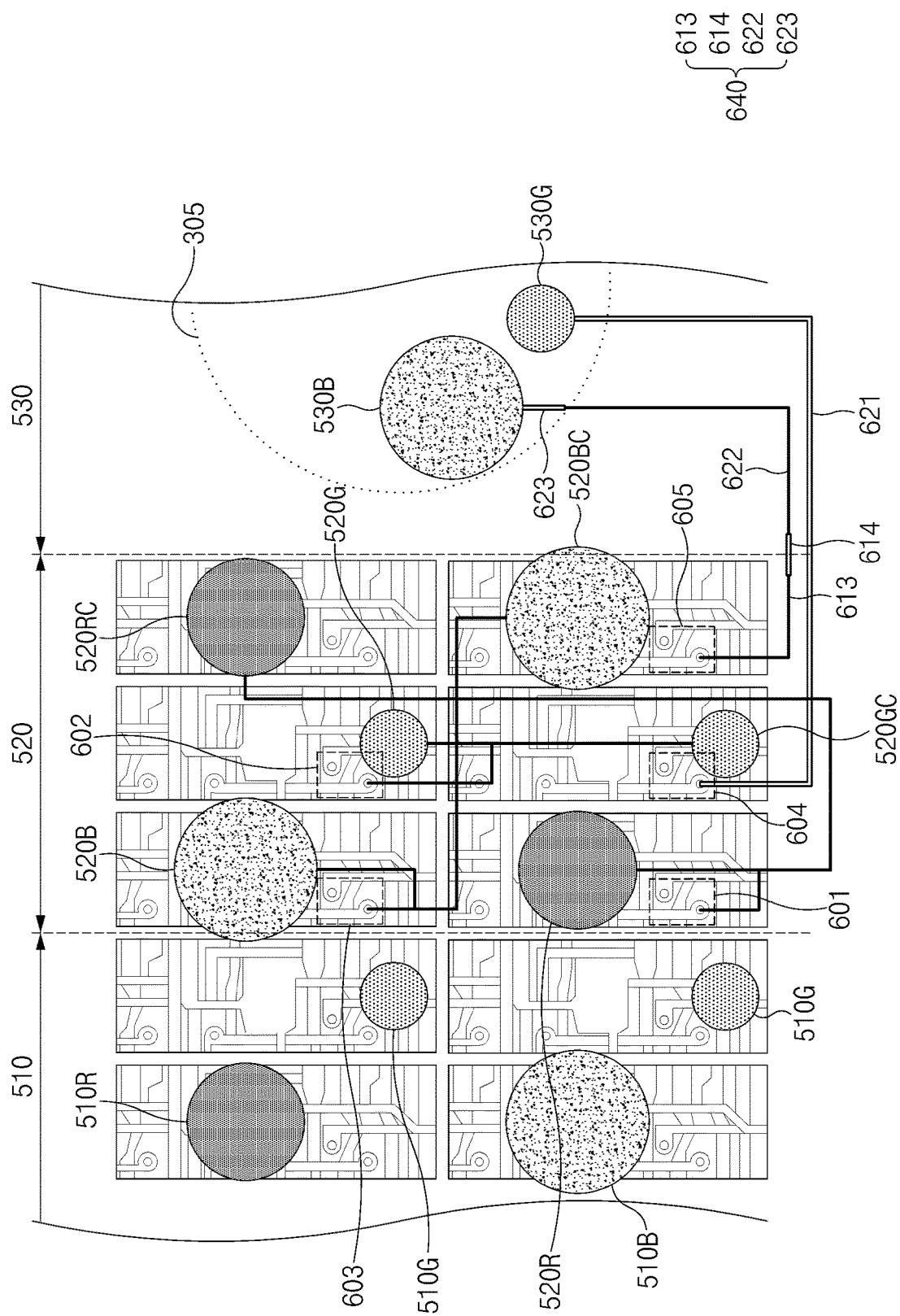
FIG. 6 is a view illustrating a display of an electronic device according to an embodiment of the disclosure.

FIG. 6 is a view 600 illustrating a display (e.g., the display 210 of FIG. 4) of an electronic device (e.g., the electronic device 101 of FIG. 4) according to an embodiment of the disclosure.

Referring to FIG. 6, first light emitting elements 510R, 510G, and 510B (e.g., the first light emitting elements 511 of FIG. 5B) may be disposed in a normal area 510. Second light emitting elements 520R, 520G, 520B, 520RC, 520GC, and 520BC (e.g., the second light emitting elements 521 of FIG. 5B) may be disposed in a circuit area 520. Third light emitting elements 530G and 530B (e.g., the third light emitting elements 531 of FIG. 5B) may be disposed in a camera light-receiving area 530. The first light emitting elements 510R, 510G, and 510B may include the red-pixel 510R, the green-pixel 501G, and the blue-pixel 510B. The second light emitting elements 520R, 520G, 520B, 520RC, 520GC, and 520BC may include the circuit red-pixel 520R, the circuit green-pixel 520G, the circuit blue-pixel 520B, the copied circuit red-pixel 520RC, the copied circuit green-pixel 520GC, and the copied circuit blue-pixel 520BC. The third light emitting elements 530G and 530B may include the camera green-pixel 530G and the camera blue-pixel 530B.

The arrangement density of the second light emitting elements 520R, 520G, 520B, 520RC, 520GC, and 520BC may be increased by copying the circuit red-pixel 520R, the circuit green-pixel 520G, and the circuit blue-pixel 520B that are disposed in the circuit area 520. The copied circuit red-pixel 520RC, the copied circuit green-pixel 520GC, and the copied circuit blue-pixel 520BC may be generated by copying anodes constituting the circuit red-pixel 520R, the circuit green-pixel 520G, and the circuit blue-pixel 520B and data lines connected with the anodes of the circuit red-pixel 520R, the circuit green-pixel 520G, and the circuit blue-pixel 520B. The data lines connected with the anodes of the circuit red-pixel 520R, the circuit green-pixel 520G, and the circuit blue-pixel 520B may be implemented by using a bottom metal layer. Accordingly, the data lines connected with the anodes of the circuit red-pixel 520R, the circuit green-pixel 520G, and the circuit blue-pixel 520B may be implemented without an additional layer. For example, the first light emitting elements 510R, 510G, and 510B and the second light emitting elements 520R, 520G, 520B, 520RC, 520GC, and 520BC may be disposed at substantially the same density. However, without being limited thereto, the arrangement density of the second light emitting elements 520R, 520G, 520B, 520RC, 520GC, and 520BC may be controlled such that there is no substantial difference in visibility performance between the circuit area 520 and the normal area 510.

A first circuit 601, a second circuit 602, a third circuit 603, a fourth circuit 604, and a fifth circuit 605 may be disposed in the circuit area 520.

The first circuit 601 may be connected with a line connected with the circuit red-pixel 520R. The line connected with the circuit red-pixel 520R may connect the circuit red-pixel 520R and the copied circuit red-pixel 520RC. The line connected with the circuit red-pixel 520R may be implemented with a bottom metal layer.

The second circuit 602 may be connected with a line connected with the circuit green-pixel 520G. The line connected with the circuit green-pixel 520G may connect the circuit green-pixel 520G and the copied circuit green-pixel 520GC. The line connected with the circuit green-pixel 520G may be implemented with a bottom metal layer.

The third circuit 603 may be connected with a line connected with the circuit blue-pixel 520B. The line connected with the circuit blue-pixel 520B may connect the circuit blue-pixel 520B and the copied circuit blue-pixel 520BC. The line connected with the circuit blue-pixel 520B may be implemented with a bottom metal layer.

The fourth circuit 604 may be connected with the camera green-pixel 530G. The camera green-pixel 530G may be connected with the fourth circuit 604 through a first camera area line 621. The first camera area line 621 may transfer a drive voltage of a drive transistor of the fourth circuit 604 to the camera green-pixel 530G. The first camera area line 621 may be implemented with a transparent member.

The fifth circuit 605 may be connected with the camera blue-pixel 530B. The camera blue-pixel 530B may be connected with the fifth circuit 605 through a second camera area line 640. The second camera area line 640 may transfer a drive voltage of a drive transistor of the fifth circuit 605 to the camera blue-pixel 530B. At least part of the second camera area line 640 may be implemented with a bottom metal layer.

The second camera area line 640 may include bottom metal layer portions 613 and 622, a bridge 614, and a transparent member portion 623.

Portions of the second camera area line 640 that do not overlap a circuit area line 611 and the camera 305 may be implemented with the bottom metal layer portions 613 and 622. When the second camera area line 640 in the circuit area 520 is implemented with a bottom metal layer, the density of the second light emitting elements 521 disposed in the circuit area 520 may be increased. Furthermore, when the second camera area line 640 in the circuit area 520 is implemented with the bottom metal layer, the resistance of the second camera area line 640 may be decreased.

A portion of the second camera area line 640 that overlaps or crosses another line (not illustrated) that is disposed in the circuit area 520 may be implemented with the bridge 614. The bridge 614 may be formed in a different layer from a bottom metal layer that forms the other line disposed in the circuit area 520. When the portion overlapping or crossing the other line disposed in the circuit area 520 is implemented with the bridge 614, the second camera area line 640 may be electrically separated from the other line disposed in the circuit area 520.

A portion of the second camera area line 640 that overlaps the camera 305 may be implemented with the transparent member portion 623. When the second camera area line 640 in the camera light-receiving area 530 is implemented with the transparent member portion 623, the light transmittance of the camera light-receiving area 530 may be increased.

Figure 7:
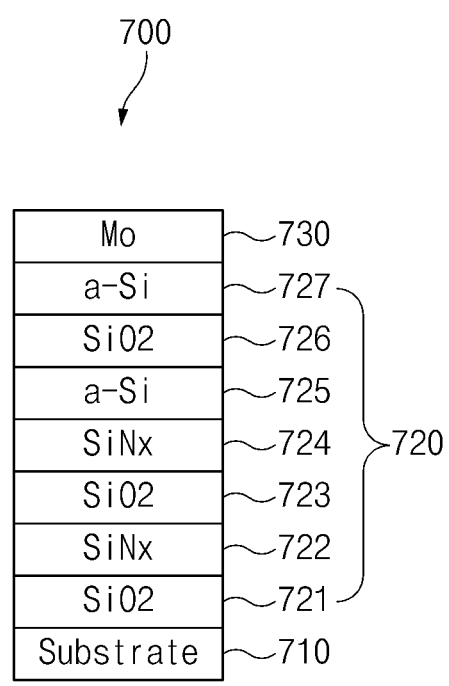
FIG. 7 is a view illustrating a stack structure of a bottom metal layer of a display according to an embodiment of the disclosure.

FIG. 7 is a view 700 illustrating a stack structure of a bottom metal layer 730 of a display (e.g., the display 210 of FIG. 4) according to an embodiment of the disclosure.

The stack structure according to an embodiment may include a substrate 710, a stack portion 720, and the bottom metal layer 730.

Referring to FIG. 7, the substrate 710 may be substantially the same as a lower substrate of a display panel. The substrate 710 may have a structure in which polyimide (PI) and silicon oxide ($SiO_2$) are alternately stacked. For example, the substrate 710 may have a structure in which three layers are stacked in the sequence of polyimide, silicon oxide, and polyimide. The substrate 710 may have a thickness of about 6000 Å. In an embodiment, the substrate 710 may be a flexible substrate. Various flexible materials, such as metal foil or thin glass, may be used for the substrate 710.

The stack portion 720 may have a structure in which silicon oxide, silicon nitride (SiNx), and amorphous silicon (a-Si) are alternately stacked. For example, the stack portion 720 may have a structure in which first silicon oxide 721, first silicon nitride 722, second silicon oxide 723, second silicon nitride 724, first amorphous silicon 725, third silicon oxide 726, and second amorphous silicon 727 are stacked.

The first silicon oxide 721, the first silicon nitride 722, the second silicon oxide 723, the second silicon nitride 724, the first amorphous silicon 725, the third silicon oxide 726, and the second amorphous silicon 727 may each have a preset thickness. For example, the first silicon oxide 721 may have a thickness of about 1690 Å. For example, the first silicon nitride 722 may have a thickness of about 1210 Å. For example, the second silicon oxide 723 may have a thickness of about 870 Å. For example, the second silicon nitride 724 may have a thickness of about 520 Å. For example, the first amorphous silicon 725 may have a thickness of about 620 Å. For example, the third silicon oxide 726 may have a thickness of about 870 Å. For example, the second amorphous silicon 727 may have a thickness of about 290 Å.

The bottom metal layer 730 may be formed of an opaque material on the stack portion 720. The bottom metal layer 730 may have excellent electrical conductivity. For example, the bottom metal layer 730 may be formed of metal such as molybdenum (Mo). The thickness of the bottom metal layer 730 may be set depending on the material of the bottom metal layer 730. For example, when the bottom metal layer 730 is formed of molybdenum, the bottom metal layer 730 may have a thickness of about 800 Å.

Figure 8:
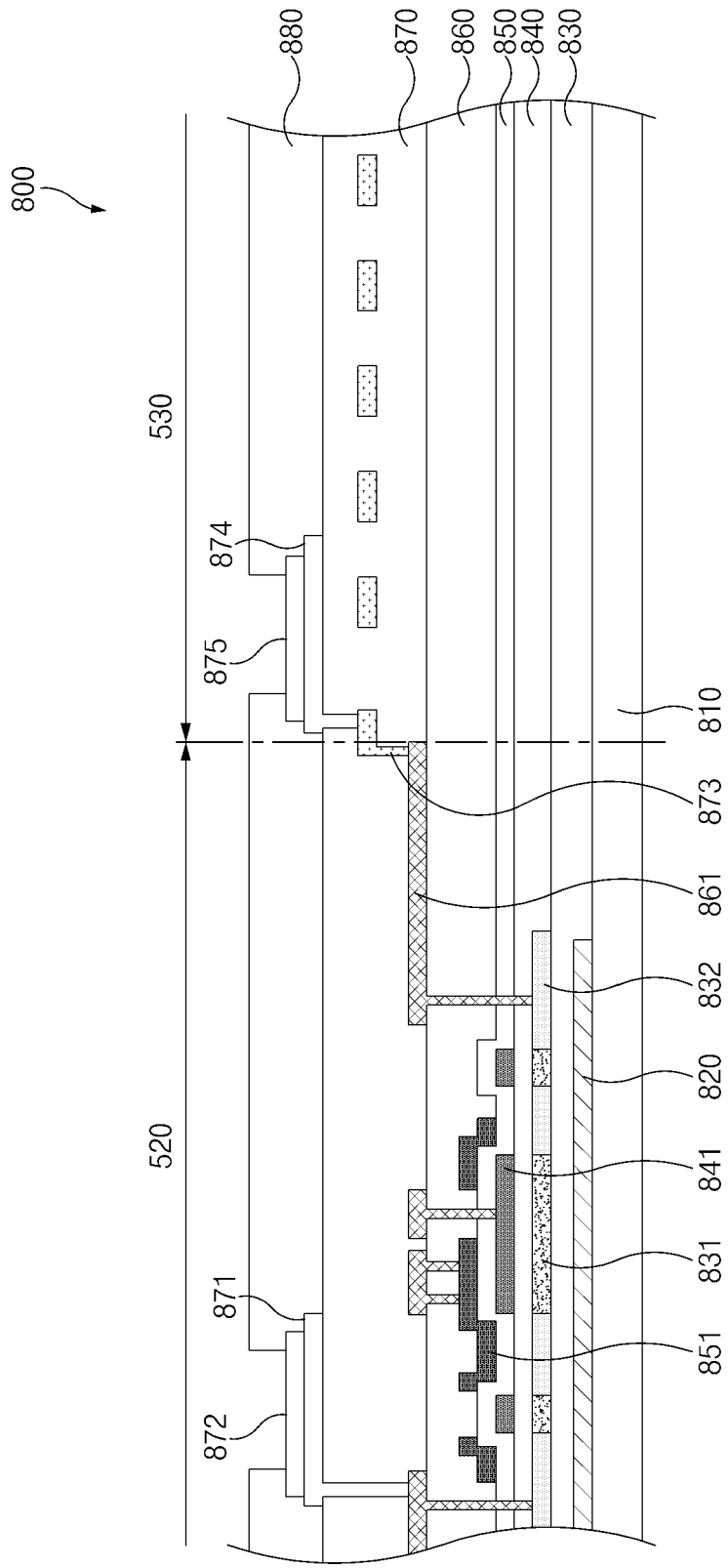
FIG. 8 is a sectional view illustrating an under display area of a display according to an embodiment of the disclosure.

FIG. 8 is a sectional view 800 illustrating an under display area (e.g., the under display area 540 of FIG. 5B) of a display (e.g., the display 210 of FIG. 4) according to an embodiment of the disclosure.

Referring to FIG. 8, the under display area 540 according to an embodiment may include a circuit area 520 and a camera light-receiving area 530.

A lower substrate 810 may form the lowermost layer of the circuit area 520 and the lowermost layer of the camera light-receiving area 530. The lower substrate 810 may be formed of glass or polyimide (PI).

A bottom metal layer 820 may be formed on the lower substrate 810. The bottom metal layer 820 may be formed in at least part of the circuit area 520.

In an embodiment, a buffer layer 830 may cover the lower substrate 810 and an upper surface of the bottom metal layer 820. The buffer layer 830 may protect the circuit area 520 and the camera light-receiving area 530 from an impact.

A first active layer 831 may form a low-temperature polycrystalline silicon (LTPS) thin film transistor (TFT). For example, the first active layer 831 may form a transistor of a circuit that forms a pixel. The first active layer 831 may be implemented in a form such as a low-temperature polycrystalline oxide (LTPO) transistor, a hybrid oxide and polycrystalline silicon (HOP) transistor, or an oxide transistor.

The second active layer 832 may transfer a data voltage.

A first gate insulating film 840 may electrically separate upper and lower layers.

A first metal layer 841 may form a gate of a transistor.

A second gate insulating film 850 may electrically separate upper and lower layers.

A second metal layer 851 may form a source electrode and a drain electrode of the transistor.

An intermediate insulating film 860 may electrically separate upper and lower layers.

A data line 861 may be connected with the second active layer 832. The data line 861 may transfer the data voltage from the transistor of the circuit area 520 to a light emitting element (e.g., the third light emitting elements 531 of FIG. 5B) of the camera light-receiving area 530.

A protective layer 870 may protect the data line 861.

A first anode 871 and a first emissive layer 872 may form a light emitting element (e.g., the second light emitting elements 521 of FIG. 5B) of the circuit area 520.

A transparent electrode 873 may be included in the protective layer 870. For example, the transparent electrode 873 may be disposed inside the protective layer 870. The transparent electrode 873 may be connected with the data line 861. The transparent electrode 873 may transfer the data voltage. The transparent electrode 873 may be formed in the camera light-receiving area 530.

A second anode 874 and a second emissive layer 875 may form a light emitting element (e.g., the third light emitting elements 531 of FIG. 5B) of the camera light-receiving area 530. The second anode 874 and the second emissive layer 875 may form a pixel that receives a drive voltage from a drive transistor disposed in the circuit area 520.

The second anode 874 may be connected with the transparent electrode 873. The second anode 874 may form the light emitting element 531 of the camera light-receiving area 530. The second anode 874 may receive the data voltage from the transparent electrode 873.

An encapsulation layer 880 may cover the first anode 871, the protective layer 870 including the transparent electrode 873, and the second anode 874. The encapsulation layer 880 may expose the first emissive layer 872 and the second emissive layer 875.

When the distance from the circuit area 520 to the camera light-receiving area 530 is shorter than a specified distance, the data line 861 and the second anode 874 may be connected by using the transparent electrode 873.

Figure 9:
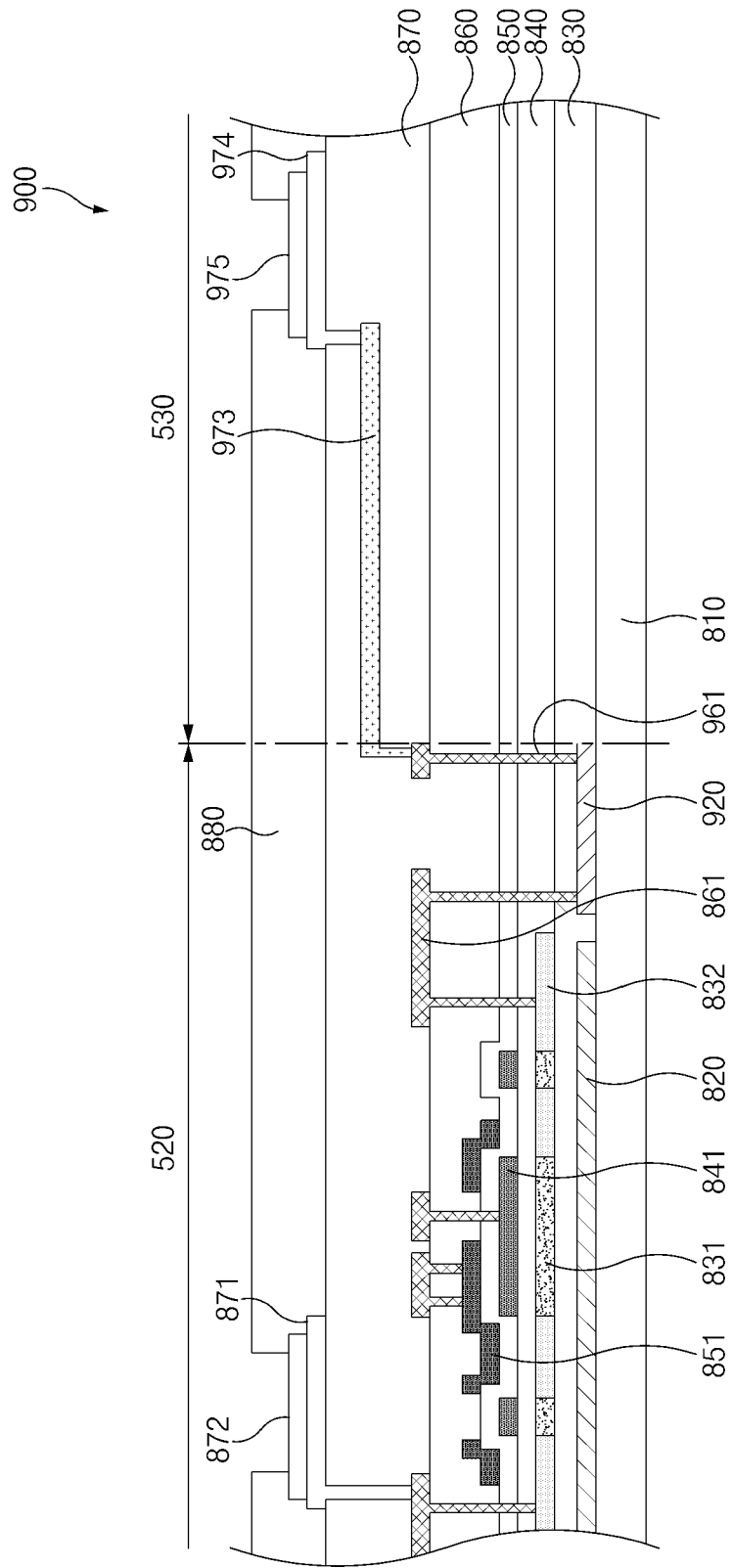
FIG. 9 is a sectional view illustrating an under display area of a display according to an embodiment of the disclosure.

FIG. 9 is a sectional view 900 illustrating an under display area (e.g., the under display area 540 of FIG. 5B) of a display (e.g., the display 210 of FIG. 4) according to an embodiment of the disclosure. Descriptions of portions in the sectional view 900 of FIG. 9 substantially the same as those in the sectional view 800 of FIG. 8 will be omitted.

Referring to FIG. 9, at least a portion 920 of a bottom metal layer 820 and 920 may be formed in a circuit area 520 so as to be adjacent to a camera light-receiving area 530.

A data line 861 may connect a second active layer 832 and the bottom metal layer 920 formed adjacent to the camera light-receiving area 530. The data line 861 may transfer a data voltage to the bottom metal layer 920 formed adjacent to the camera light-receiving area 530.

An additional data line 961 may connect the bottom metal layer 920, which is formed adjacent to the camera light-receiving area 530, with a transparent electrode 973. The additional data line 961 may transfer the data voltage to the transparent electrode 973.

A second anode 974 and a second emissive layer 975 may form a light emitting element (e.g., the third light emitting elements 531 of FIG. 5B) of the camera light-receiving area 530. The second anode 974 and the second emissive layer 975 may form a pixel that receives a drive voltage from a drive transistor disposed in the circuit area 520.

The transparent electrode 973 may connect the additional data line 961 with the second anode 974. The transparent electrode 973 may transfer the data voltage to the second anode 974.

An encapsulation layer 880 may cover a first anode 871, a protective layer 870 including the transparent electrode 973, and the second anode 974. The encapsulation layer 880 may expose a first emissive layer 872 and the second emissive layer 975.

When the distance from the circuit area 520 to the camera light-receiving area 530 is greater than or equal to a specified distance, the data line 861 and the second anode 974 may be connected by using the bottom metal layer 920, which is formed adjacent to the camera light-receiving area 530, and the transparent electrode 973.

Figure 10:
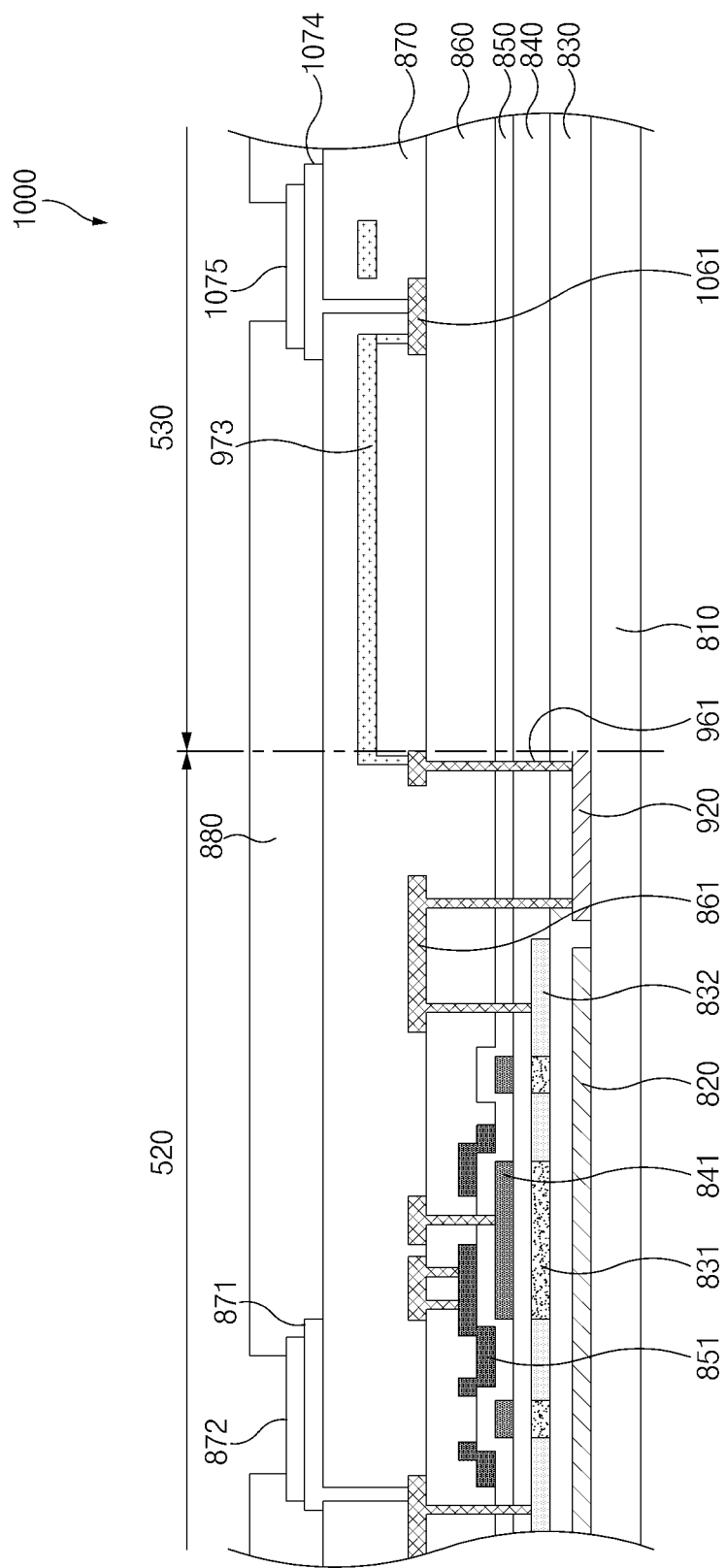
FIG. 10 is a sectional view illustrating an under display area of a display according to an embodiment of the disclosure.

FIG. 10 is a sectional view 1000 illustrating an under display area (e.g., the under display area 540 of FIG. 5B) of a display (e.g., the display 210 of FIG. 4) according to an embodiment of the disclosure. Descriptions of portions in the sectional view 1000 of FIG. 10 substantially the same as those in the sectional view 900 of FIG. 9 will be omitted.

Referring to FIG. 10, a second anode 1074 and a second emissive layer 1075 may form a light emitting element (e.g., the third light emitting elements 531 of FIG. 5B) of a camera light-receiving area 530. The second anode 1074 and the second emissive layer 1075 may form a pixel that receives a drive voltage from a drive transistor disposed in a circuit area 520.

A bridge data line 1061 may be disposed in the camera light-receiving area 530. The bridge data line 1061 may be disposed such that at least a portion thereof overlaps the second anode 1074. The bridge data line 1061 may connect a transparent electrode 973 and the second anode 1074.

An encapsulation layer 880 may cover a first anode 871, a protective layer 870 including the transparent electrode 973, and the second anode 1074. The encapsulation layer 880 may expose a first emissive layer 872 and the second emissive layer 1075.

Figure 11:
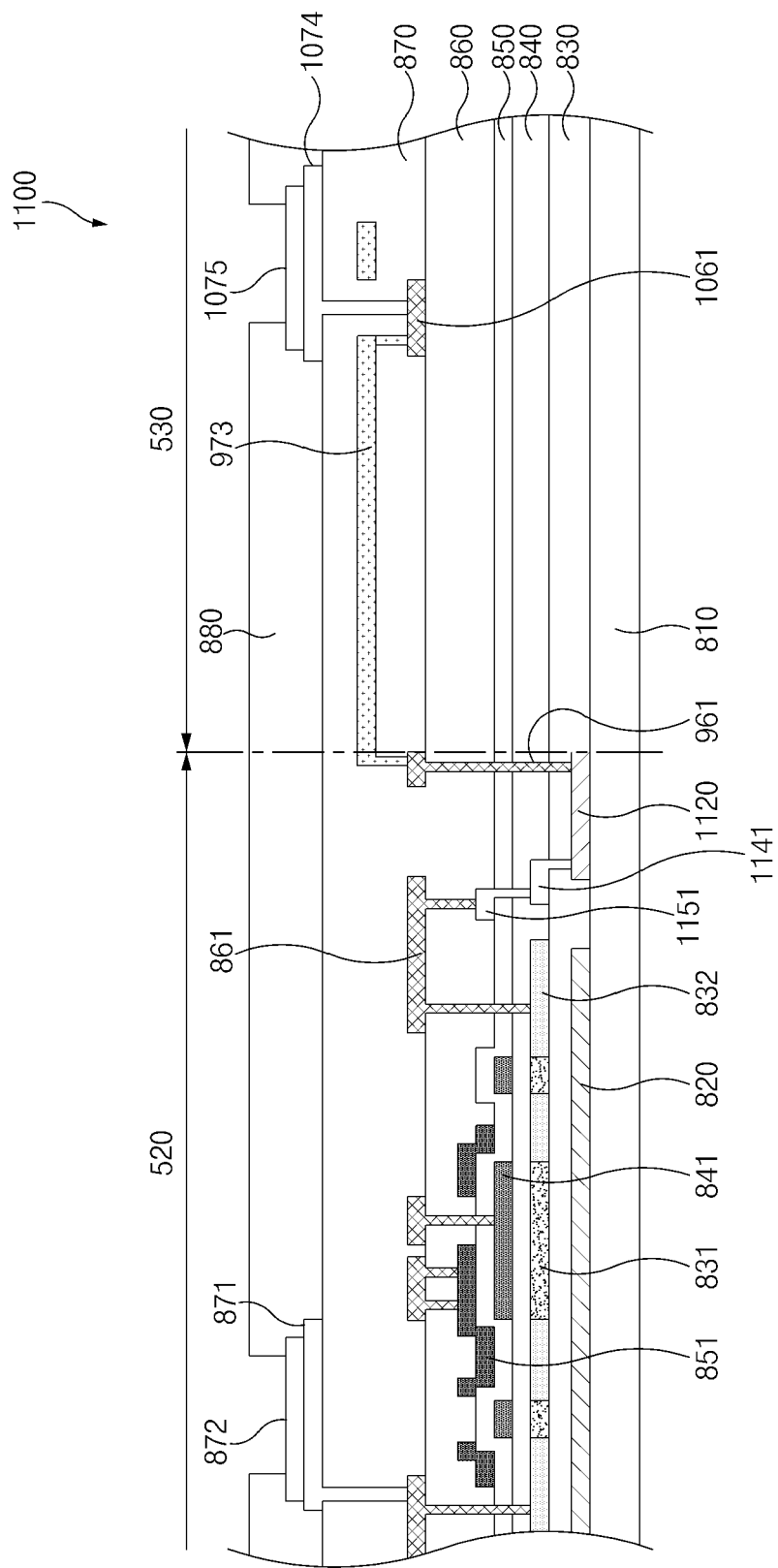
FIG. 11 is a sectional view illustrating an under display area of a display according to an embodiment of the disclosure.

FIG. 11 is a sectional view 1100 illustrating an under display area (e.g., the under display area 540 of FIG. 5B) of a display (e.g., the display 210 of FIG. 4) according to an embodiment of the disclosure. Descriptions of portions in the sectional view 1100 of FIG. 11 substantially the same as those in the sectional view 1000 of FIG. 10 will be omitted.

Referring to FIG. 11, at least a portion 1120 of a bottom metal layer 820 and 1120 may be formed in a circuit area 520 so as to be adjacent to a camera light-receiving area 530.

A third metal layer 1141 may be electrically connected with the bottom metal layer 1120 formed adjacent to the camera light-receiving area 530. The third metal layer 1141 may be formed through the same process as a first metal layer 841. The third metal layer 1141 may be formed of substantially the same material as the first metal layer 841.

A fourth metal layer 1151 may be electrically connected with the third metal layer 1141. The fourth metal layer 1151 may be formed through the same process as a second metal layer 851. The fourth metal layer 1141 may be formed of substantially the same material as the second metal layer 851.

A data line 861 may connect a second active layer 832 and the fourth metal layer 1151. The data line 861 may transfer a data voltage to the fourth metal layer 1151.

The fourth metal layer 1151 may connect the data line 861 and the third metal layer 1141. The fourth metal layer 1151 may transfer the data voltage to the third metal layer 1141.

The third metal layer 1141 may connect the fourth metal layer 1151 and the bottom metal layer 1120 formed adjacent to the camera light-receiving area 530. The third metal layer 1141 may transfer the data voltage to the bottom metal layer 1120 formed adjacent to the camera light-receiving area 530.

An electronic device (e.g., the electronic device 101 of FIG. 1) according to an embodiment of the disclosure may include a display (e.g., the display 210 of FIG. 2), a display driver IC (e.g., the display driver IC 230 of FIG. 2) that controls the display 210, a camera (e.g., the camera 305 of FIG. 3) disposed in a display area of the display 210, and a processor (e.g., the processor 120 of FIG. 1) operatively connected with the display driver IC 230 and the camera 305. The display 210 may include a normal area (e.g., the normal area 510 of FIG. 5A) having a first pixel density, a camera light-receiving area (e.g., the camera light-receiving area 530 of FIG. 5A) where the camera 305 is disposed and at least one pixel (e.g., the camera green-pixel 530G and the camera blue-pixel 530B of FIG. 6) is disposed, the camera light-receiving area having a second pixel density lower than first pixel density, and a circuit area (e.g., the circuit area 520 of FIG. 5A) that is provided between the normal area 510 and the camera light-receiving area 530 and that has a third pixel density, and a circuit (e.g., the fourth circuit 604 and/or the fifth circuit 605 of FIG. 6) that transfers a drive voltage to the pixel disposed in the camera light-receiving area 530 may be disposed in the circuit area. The third pixel density may be lower than or equal to the first pixel density, and the third pixel density may be higher than the second pixel density.

In an embodiment, the number of second light emitting elements (e.g., the second light emitting elements 521 of FIG. 5B) that are light emitting elements disposed in the circuit area 520 may be larger than the number of second circuits disposed in the circuit area 520.

In an embodiment, a density at which the second light emitting elements 521 are disposed in the circuit area 520 may be substantially the same as the first pixel density.

In an embodiment, at least one pixel disposed in the circuit area 520 may include a first pixel (e.g., the circuit red-pixel 520B of FIG. 6) and a second pixel (e.g., the copied circuit red-pixel 520BC of FIG. 6) copied from the first pixel 520B.

In an embodiment, the first pixel 520B and the second pixel 520BC may have the same color.

In an embodiment, a first transmission line (e.g., the first transmission line 523 of FIG. 5B) may be disposed in the circuit area 520, and a second transmission line (e.g., the second transmission line 533 of FIG. 5B) may be disposed in the camera light-receiving area 530.

In an embodiment, resistance of a bottom metal layer that forms the first transmission line 523 may be lower than resistance of a transparent member that forms the second transmission line 533.

In an embodiment, resistance between the first transmission line 523 and the second transmission line 533 may be matched.

In an embodiment, a transmission line (e.g., the second camera area line 640 of FIG. 6) may be disposed across the circuit area 520 and the camera light-receiving area 530, and a portion of the transmission line 640 not overlapping another transmission line or the camera 305 may be implemented with a bottom metal layer 613 and 622.

In an embodiment, a portion of the transmission line 640 overlapping or crossing the other transmission line may be implemented with a bridge (e.g., the bridge 614 of FIG. 6).

In an embodiment, a portion of the transmission line overlapping the camera 305 may be implemented with a transparent member (e.g., the transparent member portion 623 of FIG. 6).

An electronic device 101 according to an embodiment of the disclosure may include a display 210 including a bottom metal layer (e.g., the bottom metal layer 820 and 920 of FIG. 8), a display driver IC 230 that controls the display 210, a camera 305 disposed in a display area of the display 210, and a processor 120 operatively connected with the display driver IC 230 and the camera. The display 210 may include a normal area 510, a camera light-receiving area 530 where the camera 305 is disposed, and a circuit area 520 provided between the normal area 510 and the camera light-receiving area 530, and a circuit 604 and 605 that transfers a drive voltage to a pixel disposed in the camera light-receiving area 530 may be disposed in the circuit area 520. At least part of a data line (e.g., the data line 861 and 961 of FIG. 9) connected with a first electrode (e.g., the second active layer 832 of FIG. 9) of at least one pixel disposed in the circuit area 520 may be implemented with the bottom metal layer 920.

In an embodiment, the data line 861 and 961 and a second electrode (e.g., the second anode 974 of FIG. 9) of at least one light emitting element disposed in the camera light-receiving area 530 may be connected by using a transparent electrode (e.g., the transparent electrode 973 of FIG. 9), when a distance from the circuit area 520 to the camera light-receiving area 530 is shorter than a specified distance.

In an embodiment, the data line 861 and 961 and the second electrode 974 may be connected by using the bottom metal layer (e.g., the bottom metal layer 920 of FIG. 9) formed adjacent to the camera light-receiving area 530 and the transparent electrode 973, when the distance from the circuit area 520 to the camera light-receiving area 530 is greater than or equal to the specified distance.

In an embodiment, the bottom metal layer 613 and 622 may be formed of molybdenum (Mo).

A display 210 having a display area under which a camera 305 is disposed according to an embodiment of the disclosure may include a normal area 510 having a first pixel density, a camera light-receiving area 530 where the camera 305 is disposed and at least one pixel 530G and 530B is disposed, the camera light-receiving area 530 having a second pixel density lower than first pixel density, and a circuit area 520 that is provided between the normal area and the camera light-receiving area and that has a third pixel density, and a circuit that transfers a drive voltage to the pixel disposed in the camera light-receiving area 530 may be disposed in the circuit area 520. The third pixel density may be lower than or equal to the first pixel density, and the third pixel density may be higher than the second pixel density.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a display;
   a display driver integrated circuit (IC) configured to control the display;
   a camera disposed in a display area of the display; and
   a processor operatively connected with the display driver IC and the camera,
   wherein the display includes:
      a normal area having a first pixel density,
      a camera light-receiving area where the camera is disposed and at least one pixel is disposed, the camera light-receiving area having a second pixel density lower than first pixel density, and
      a circuit area provided between the normal area and the camera light-receiving area, the circuit area having a third pixel density, wherein a circuit configured to transfer a drive voltage to the pixel disposed in the camera light-receiving area is disposed in the circuit area,
   wherein the third pixel density is lower than or equal to the first pixel density,
   wherein the third pixel density is higher than the second pixel density,
   wherein a first transmission line having a first resistance is disposed in the circuit area,
   wherein a second transmission line having a second resistance is disposed in the camera light-receiving area, and
   wherein the first resistance is lower than the second resistance.

2. The electronic device of claim 1, wherein the number of second light emitting elements that are light emitting elements disposed in the circuit area is larger than the number of second circuits disposed in the circuit area.

3. The electronic device of claim 2, wherein a density at which the second light emitting elements are disposed in the circuit area is substantially the same as the first pixel density.

4. The electronic device of claim 1, wherein at least one pixel disposed in the circuit area includes a first pixel and a second pixel copied from the first pixel.

5. The electronic device of claim 4, wherein the first pixel and the second pixel have the same color.

6. The electronic device of claim 1,
   wherein a bottom metal layer is configured to form the first transmission line, and
   wherein a transparent member is configured to form the second transmission line.

7. The electronic device of claim 1, wherein a resistance between the first transmission line and the second transmission line is matched.

8. The electronic device of claim 1,
wherein the first transmission line is disposed across the circuit area and the camera light-receiving area, and
wherein a portion of the first transmission line not overlapping with the second transmission line or the camera is implemented with a bottom metal layer.

9. The electronic device of claim 8, wherein a portion of the first transmission line overlapping or crossing the second transmission line is implemented with a bridge.

10. The electronic device of claim 8, wherein a portion of the first transmission line overlapping the camera is implemented with a transparent member.

11. An electronic device comprising:
a display including a bottom metal layer;
a display driver IC configured to control the display;
a camera disposed in a display area of the display; and
a processor operatively connected with the display driver IC and the camera,
wherein the display includes:
a normal area,
a camera light-receiving area where the camera is disposed, and
a circuit area provided between the normal area and the camera light-receiving area, wherein a circuit configured to transfer a drive voltage to a pixel disposed in the camera light-receiving area is disposed in the circuit area, and
wherein at least part of a first data line connected with a first electrode of at least one pixel disposed in the circuit area is implemented with the bottom metal layer,
wherein the at least part of the first data line has a first resistance,
wherein a second data line having a second resistance is disposed in the camera light-receiving area, and
wherein the first resistance is lower than the second resistance.

12. The electronic device of claim 11, wherein the first data line and a second electrode of at least one light emitting element disposed in the camera light-receiving area are connected by using a transparent electrode, when a distance from the circuit area to the camera light-receiving area is shorter than a specified distance.

13. The electronic device of claim 12, wherein the first data line and the second electrode are connected by using the bottom metal layer formed adjacent to the camera light-receiving area and the transparent electrode, when the distance from the circuit area to the camera light-receiving area is greater than or equal to the specified distance.

14. The electronic device of claim 11, wherein the bottom metal layer is formed of molybdenum (Mo).

15. A display having a display area under which a camera is disposed, the display comprising:
a normal area having a first pixel density;
a camera light-receiving area where the camera is disposed and at least one pixel is disposed, the camera light-receiving area having a second pixel density lower than first pixel density; and
a circuit area provided between the normal area and the camera light-receiving area, the circuit area having a third pixel density, wherein a circuit configured to transfer a drive voltage to the pixel disposed in the camera light-receiving area is disposed in the circuit area,
wherein the third pixel density is lower than or equal to the first pixel density,
wherein the third pixel density is higher than the second pixel density,
wherein a first transmission line having a first resistance is disposed in the circuit area,
wherein a second transmission line having a second resistance is disposed in the camera light-receiving area, and
wherein the first resistance is lower than the second resistance.

16. The display of claim 15, wherein the number of second light emitting elements that are light emitting elements disposed in the circuit area is larger than the number of second circuits disposed in the circuit area.

17. The display of claim 16, wherein a density at which the second light emitting elements are disposed in the circuit area is substantially the same as the first pixel density.

18. The display of claim 15, wherein at least one pixel disposed in the circuit area includes a first pixel and a second pixel copied from the first pixel.

19. The display of claim 18, wherein the first pixel and the second pixel have the same color.

* * * * *